(12) United States Patent
Cristaudo et al.

(10) Patent No.: US 7,183,846 B2
(45) Date of Patent: Feb. 27, 2007

(54) DEVICE FOR DETECTING THE POWER OF A SIGNAL AND INTEGRATED CIRCUIT WITH AMPLIFIER AND RELATED POWER DETECTION DEVICE

(75) Inventors: Domenico Cristaudo, Misterbianco (IT); Antonino Scuderi, Misterbianco (IT); Giuseppe Palmisano, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 80 days.

(21) Appl. No.: 11/043,685

(22) Filed: Jan. 26, 2005

(65) Prior Publication Data

US 2005/0195029 A1  Sep. 8, 2005

(30) Foreign Application Priority Data

Jan. 26, 2004  (EP) .................................. 04425041

(51) Int. Cl.
*H03G 3/20* (2006.01)
(52) U.S. Cl. .................................................. 330/140
(58) Field of Classification Search ............... 330/140, 330/307
See application file for complete search history.

(56) References Cited

U.S. PATENT DOCUMENTS

| | | | |
|---|---|---|---|
| 3,441,931 A * | 4/1969 | Shrader ....................... 342/160 |
| 4,490,681 A | 12/1984 | Turner ......................... 329/352 |
| 4,577,159 A * | 3/1986 | Pace .............................. 330/9 |
| 5,408,197 A * | 4/1995 | Miyake ....................... 330/129 |
| 5,901,173 A | 5/1999 | Stephens et al. ............ 375/227 |
| 5,982,236 A * | 11/1999 | Ishikawa et al. ............ 330/296 |
| 2003/0042885 A1 | 3/2003 | Zhou et al. .................. 324/105 |

FOREIGN PATENT DOCUMENTS

WO    WO01/80421    10/2001

OTHER PUBLICATIONS

European Search Report dated Jul. 19, 2004 for European Patent Appl. No. EP04425041.

* cited by examiner

*Primary Examiner*—Benny Lee
*Assistant Examiner*—Alan Wong
(74) *Attorney, Agent, or Firm*—Lisa K. Jorgenson; Jon A. Gibbons; Fleit, Kain, Gibbons, Gutman, Bongini, & Bianco P.L.

(57) ABSTRACT

The present invention describes a device for detecting the power of a first signal at a given frequency. The device comprises a first circuit means for detecting the envelope of the first signal and a second circuit means coupled to the first circuit means and suitable for generating a second signal proportional to the average of the envelope detected. The second signal is proportional to the square root of the average power of the first signal.

16 Claims, 2 Drawing Sheets

DEVICE FOR DETECTING THE POWER OF A SIGNAL AND INTEGRATED CIRCUIT WITH AMPLIFIER AND RELATED POWER DETECTION DEVICE

CROSS-REFERENCE TO RELATED APPLICATIONS

This application is based upon and claims priority from prior European Patent Application No. 04425041.3, filed on Jan. 26, 2004 the entire disclosure of which is herein incorporated by reference.

FIELD OF THE INVENTION

The present invention generally relates to a device for detecting the power of a signal and more specifically to a circuit with amplifier and related power detection device.

BACKGROUND OF THE INVENTION

In radio frequency circuits, such as in the radio frequency transmitters, power amplifiers are commonly used in a circuit block that precedes the antenna. Radio frequency transmitters typically implement, in accordance with the power radiated by the antenna, a mechanism of gain control or of energy saving that acts on the whole transmission chain. An estimate of the power at the output of the power amplifier enables the above-mentioned gain control procedures to be undertaken. To reach a high spectral efficiency in the more recent generation of transmission standards, such as the standard IEEE802.11a/g, CDMA2000, IS95, WCDMA and more, a combination of modulation in amplitude and phase is used. The modulated signal that results is at variable envelope. This category of signals is typically characterised by the ratio between instantaneous peak power and average power. The above-mentioned gain control on the transmission chain operates in accordance with the average power rather than the instantaneous peak power. For these above-mentioned gain controls the use of a detector of peak power is excluded and is not used. Further, it is unnecessary to use a detector for time integrated power or average power.

One known detector of the power of an amplifier in radio frequency is disclosed in the WO 0180421 patent. This patent describes a power amplifier circuit to amplify an input signal. The power amplifier circuit includes an amplification transistor and a circuit for detecting the power. The circuit for detecting power generates a signal that is directly proportional to the level of the power of the amplification transistor. More specifically, the circuit for detecting power generates a direct voltage proportional to the square of a current, where the current is the sum of the radio frequency current and the direct current. This current flows in the amplification transistor and produces an average of the voltage which indicates an accurate power level in the amplification transistor.

Although this power detecting circuit is useful, it is not without its problems and shortcomings. One problem is the power detecting device of an amplifier is very sensitive to temperature. Further this temperature dependency is highly dependent on the idle current of the power amplifier.

Accordingly, a need exists to overcome these problems and shortcomings of the prior art and to provide a device for detecting the power that is not sensitive to temperature and a device that does not depend on the idle current of the power amplifier.

SUMMARY OF THE INVENTION

Briefly, in accordance with the present invention, a device is provided for detecting the power of a signal that overcomes the above-mentioned problems and shortcomings.

A power detecting device of a first signal at a given frequency is disclosed. The power detecting device comprises a first circuit means for detecting the envelope of the first signal. The power detecting device further includes a second circuit means coupled to the first circuit means and suitable for generating a second signal proportional to the average of the envelope detected. The second signal is proportional to the square root of the average power of the first signal.

Still in accordance with the present invention an integrated circuit using the power detecting device is disclosed.

The present invention provides a power detecting device for detecting the power of a signal which is less sensitive to the temperature and to the supply voltage.

Further, the present invention is applied to an output signal from a power amplifier, and is not dependent on the idle current of the power amplifier.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description and non-limiting examples taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
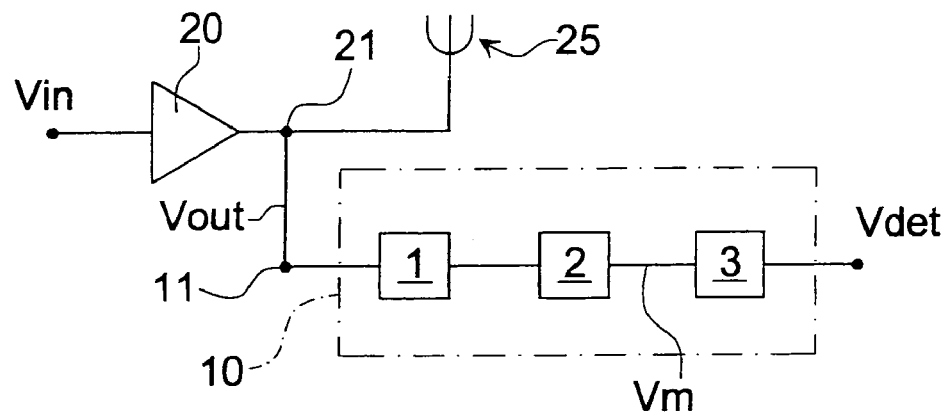
FIG. 1 is a diagram of a device for detecting the power of a signal in output from an amplifier and of the same amplifier according to the present invention.

FIG. 1 shows a diagram of a device 10 for detecting the power of a signal in output from an amplifier 20, preferably a power amplifier, and of the same amplifier according to the present invention. The amplifier 20 has an input signal Vin at a given frequency, preferably a modulated radio frequency signal (for example modulated by an audio signal with a known amplitude modulation) or simply a radio frequency signal. The amplifier 20 has an output terminal 21 on which there is a radio frequency modulated or simply radio frequency output signal Vout, connected to an antenna 25. The device 10 has an input terminal 11 connected to the output terminal 21 of the power amplifier 20 and is suited to detecting a voltage Vdet proportional to the square root of the average power Poutm of the same amplifier 20, that is the average power relative to the output signal Vout of the amplifier 20. The signal Vdet therefore has the same time course as the average power Poutm.

The device 10 comprises an envelope detector 1 suited to extracting the envelope of the modulated signal Vout coming out of the amplifier 20, in this case a signal at radio frequency.

Block 2 is an integrator suited to producing a voltage signal Vm given by the average of the envelope of the signal Vout.

The device 10 also comprises preferably a buffer 3 suited to decoupling the device 10 from the load. The signal Vdet in output from the buffer 3 is the voltage signal Vm.

FIG. 1 shows the device 10 according to the invention applied to the output signal of an amplifier 20, nonetheless said device 10 could be applied to any signal at a given frequency such as a radio frequency signal or a radio frequency modulated signal.

Figure 2:
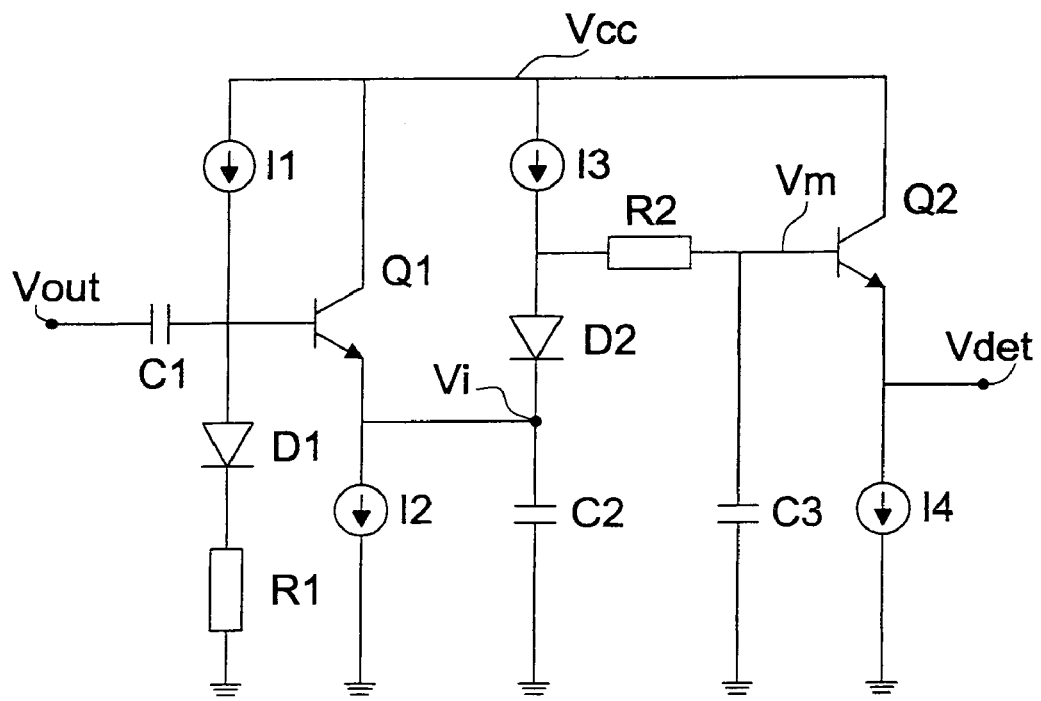
FIG. 2 is a circuit diagram of the device for detecting the power of a signal of FIG. 1.

FIG. 2 shows a circuit diagram of the device 10 of FIG. 1. The device 10 comprises a capacitor C1 positioned between the input voltage Vout and the input of the envelope detector 1; the task of the capacitor C1 is to block the continuous component of the signal Vout.

The envelope detector 1 comprises a transistor Q1, for example a bipolar transistor, whose input terminal, that coincides with the input terminal of the envelope detector 1, is made up of the base terminal of the transistor Q1. The collector terminal of the transistor Q1 is connected to the supply voltage Vcc while the emitter terminal is connected with a current generator 12 connected to ground.

The device 10 also comprises a series of a current generator I1, a diode D1 and a resistor R1; said series is positioned between a supply voltage Vcc and ground and the terminal in common of the generator I1 and of the anode of the diode D1 is connected to the input terminal of the envelope detector 1. The current generator I1 is obtained through any reference of known bandgap voltage; the current generated by I1 together with the resistor R1 and the diode D1 determines the bias of the base of the transistor Q1.

The device 10 also comprises another series of a current generator 13, a diode D2 and a capacitor C2; said series is positioned between a supply voltage Vcc and ground. The terminal in common of the generator 13 and the anode of the diode D2 is connected to the input terminal of the block 2 while the terminal in common of the cathode D2 and of a terminal of the capacitor C2 is connected to the emitter terminal of the transistor Q1.

Block 2 comprises a series of a resistor R2 and a capacitor C3 connected between the input of the block 2 and ground.

The device 10 comprises preferably a block 3 made up of a common collector bipolar transistor Q2 whose base terminal is the input of the block 3 that is connected to the common terminal of the resistor R2 and of the capacitor C3, the collector terminal is connected to the supply voltage Vcc and the emitter terminal, in which the output voltage Vdet is taken, is connected to a terminal of a current generator 14 having the other terminal connected to ground.

The voltage signal Vout leaving the amplifier 20 drives the transistor Q1; when the signal Vout is positive the transistor Q1 conducts and enables the capacitor C2 to be charged, while when it is negative the transistor Q1 is cut-off enabling the capacitance C2 to be discharged towards ground. If the signal Vout is a sinusoidal signal in radio frequency, during the rising phase of the sinusoidal waveform the transistor Q1 enables the capacitor C2 to be charged while during the descending phase the transistor Q1 is cut-off enabling the capacitance C2 to be discharged towards ground in a linear manner with a slew-rate given by (I2–I3)/C2. The choice of the slew-rate is based on a compromise between the capacity of detecting signals whose envelope varies rapidly and the rejection to the ripple due to the charging and discharging of the capacitor C2. Therefore at the leads of the capacitor C2 there will be a voltage signal that reproduces the time course of the signal Vout.

Block 2 enables the signal detected by the block 1 to be integrated and enables the elimination of the ripple generated in the block 1 that represents the highest frequency component of the envelope Vi of the signal Vout.

Block 3 enables an output voltage Vdet to be obtained that does not depend on the load applied by the output terminal of the device 10 for a very big range of values.

The presence of the diodes D1 and D2 permits the compensation of the temperature variations of the base-emitter junctions of the respective transistors Q1 and Q2. For this reason and because the voltage on the resistor R1 is proportional to a bandgap voltage, it results that the output voltage Vdet is insensitive to the temperature.

The voltage signal Vdet is insensitive to the idle current of the amplifier 20 because it depends on the measurement of the envelope of the output signal Vout of the amplifier.

The circuit 10 is also insensitive to the supply voltage Vcc because it comprises the current generators I1–I4; this comes about in the normal use conditions of the device 10 that is for amplitudes of the sinusoidal signal Vout that does not lead the current generators I1–I4 to saturation. Nevertheless it is always possible to carry out a partition of the input signal Vout of the device 10 to prevent the saturation of the current generators I1–I4.

In addition said device has no limitations on the frequency bandwidth because the integration block 2 only comprises passive electric components.

In accordance with the invention an integrated circuit can be produced comprising the amplifier 20 and the device 10. The integrated circuit comprises various pins like that for the output of the signal Vout, that for the input of the supply voltage Vcc, that for ground, the pin in which the voltage signal Vdet is present, and the pin on which the signal Vdet is present.

Figure 3:
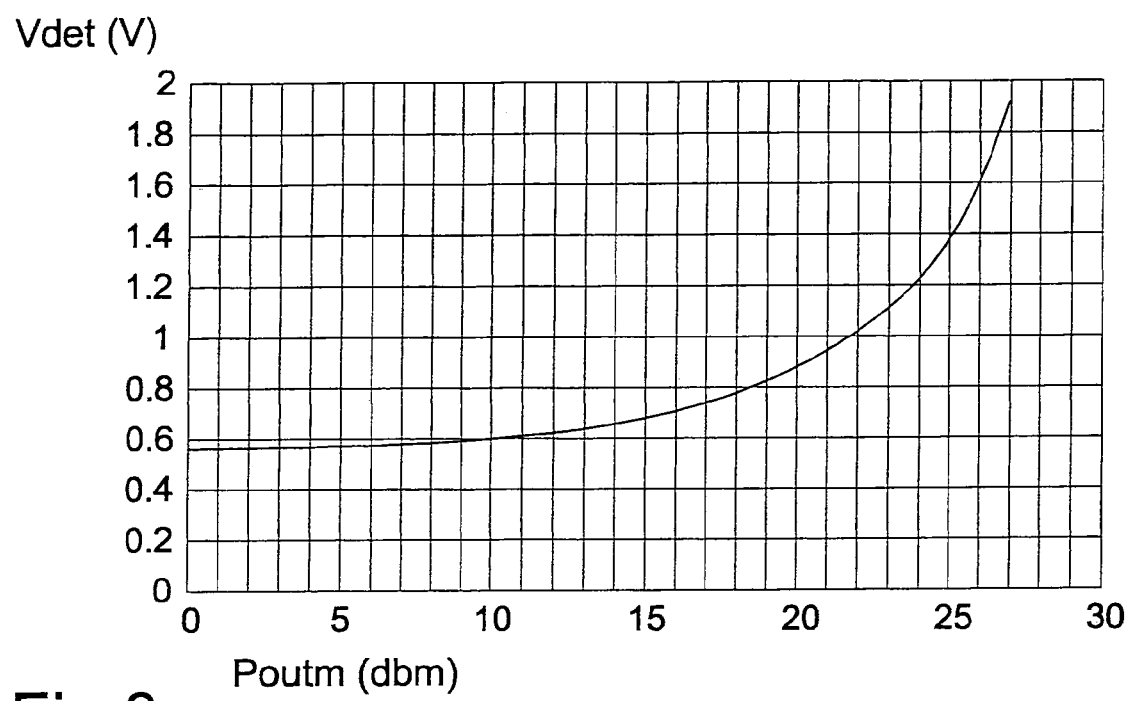
FIG. 3 is a graph of the voltage detected by the device in function of the average power of the amplifier.

FIG. 3 is a graph of the detected voltage signal Vdet in function of the average output power Poutm in decibels relating to one milliwatt of the signal in output from the amplifier 20. When the amplifier 20 operates in conditions of linearity that is in the typical operation of an amplifier in radio frequency, the detector 10 has a volume range of the output voltage of about 1 V.

The device 10 is particularly suitable for use with wide signals that is, when the signal Vout in input to the device 10 have amplitude that can be compared with the supply signal.

It is important to note that the device 10 can use other types of bipolar transistors, for example MOS transistors, with circuit modifications which are within the true scope and spirit to those of average skill in the art.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A device comprising:
   a first circuit means for detecting an envelope of a first signal, wherein the first circuit means comprises a first transistor with a base terminal coupled with the first signal and an output terminal coupled with a first capacitor, whereby when the first transistor conducts in an ON state, the first capacitor is charged with the first signal;
   a set of current generators coupled with the first capacitor and suitable for determining a linear discharge of the first capacitor when the first transistor is not conducting in an OFF state; and
   a second circuit means electrically coupled to the first circuit means, the second circuit means capable of generating a second signal proportional to an average of the envelope detected, the second signal being proportional to a square root of an average power of the first signal.

2. A device comprising:
   a first circuit means for detecting an envelope of a first signal, wherein the first circuit means comprises a first transistor with a base terminal coupled with the first signal and an output terminal coupled with a first capacitor, whereby when the first transistor conducts in an ON state, the first capacitor is charged with the first signal and wherein the first transistor is a bipolar transistor;
   a first diode suitable to compensate for a temperature variation of a base-emitter junction of the first transistor; and
   a second circuit means electrically coupled to the first circuit means, the second circuit means capable of generating a second signal proportional to an average of the envelope detected, the second signal being proportional to a square root of an average power of the first signal.

3. The device according to claim 2, wherein the second circuit means further comprises:
   a resistor and a capacitor coupled to an output of the first circuit means.

4. The device according to claim 2, further comprising:
   a buffer electrically coupled to an output of the second circuit means.

5. A device comprising:
   a first circuit means for detecting an envelope of a first signal, wherein the first circuit means comprises a first transistor with a base terminal coupled with the first signal and an output terminal coupled with a first capacitor, whereby when the first transistor conducts in an ON state, the first capacitor is charged with the first signal;
   a second circuit means electrically coupled to the first circuit means, the second circuit means capable of generating a second signal proportional to an average of the envelope detected, the second signal being proportional to a square root of an average power of the first signal; and
   a buffer electrically coupled to an output of the second circuit means, wherein the buffer further comprises:
      a second bipolar transistor; and
      wherein the first circuit means further comprises a second diode suited to compensate for any temperature variations of a base-emitter junction of the second bipolar transistor.

6. The device according to claim 2, wherein the first signal is the output signal of an amplifier.

7. The device according to claim 2, wherein the first signal is a radio frequency signal.

8. The device according to claim 2, wherein the first signal is a radio frequency modulated signal.

9. An integrated circuit comprising:
   an amplifier; and
   a power detecting device of the amplifier, the amplifier having an input signal at a given frequency and an amplified output signal, wherein the power detecting device comprises:
      a first circuit means for detecting an envelope of a first signal, wherein the first circuit means includes a first transistor with a base terminal coupled with the first signal and an output terminal coupled with a first capacitor, whereby when the first transistor conducts in an ON state, the first capacitor is charged with the first signal;
      a set of current generators coupled with the first capacitor and suitable for determining a linear discharge of the first capacitor when the first transistor is not conducting in an OFF state; and
      a second circuit means electrically coupled to the first circuit means, the second circuit means capable of generating a second signal proportional to an average of the envelope detected, the second signal being proportional to a square root of an average power of the first signal.

10. The integrated circuit according to claim 9, wherein the first transistor is a bipolar transistor and the device further comprises:
    a first diode suitable to compensate for a temperature variation of a base-emitter junction of the first transistor.

11. The integrated circuit according to claim 9, wherein the second circuit means further comprises
    a resistor and a capacitor coupled to an output of the first circuit means.

12. The integrated circuit according to claim 9, further comprising:
    a buffer electrically coupled to an output of the second circuit means.

13. An integrated circuit comprising:
    an amplifier; and
    a power detecting device of the amplifier, the amplifier having an input signal at a given frequency and an amplified output signal, wherein the power detecting device comprises:
       a first circuit means for detecting an envelope of a first signal, wherein the first circuit means includes a first transistor with a base terminal coupled with the first signal and an output terminal coupled with a first capacitor, whereby when the first transistor conducts in an ON state, the first capacitor is charged with the first signal;
       a second circuit means electrically coupled to the first circuit means, the second circuit means capable of generating a second signal proportional to an average of the envelope detected, the second signal being proportional to a square root of an average power of the first signal; and
       a buffer electrically coupled to an output of the second circuit means, wherein the buffer further comprises:
          a second bipolar transistor; and
          wherein the first circuit means further comprises a second diode suited to compensate for any temperature variations of a base-emitter junction of the second bipolar transistor.

14. The integrated circuit according to claim 10, wherein the first signal is the output signal of an amplifier.

15. The integrated circuit according to claim 10, wherein the first signal is a radio frequency signal.

16. The integrated circuit according to claim 10, wherein the first signal is a radio frequency modulated signal.

* * * * *